United States Patent
Tweet et al.

(10) Patent No.: US 6,703,293 B2
(45) Date of Patent: Mar. 9, 2004

(54) IMPLANTATION AT ELEVATED TEMPERATURES FOR AMORPHIZATION RE-CRYSTALLIZATION OF $Si_{1-x}Ge_x$ FILMS ON SILICON SUBSTRATES

(75) Inventors: Douglas J. Tweet, Camas, WA (US); Sheng Teng Hsu, Camas, WA (US); Jer-shen Maa, Vancouver, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/194,383

(22) Filed: Jul. 11, 2002

(65) Prior Publication Data

US 2004/0009626 A1 Jan. 15, 2004

(51) Int. Cl.$^7$ ............................................. H01L 21/265
(52) U.S. Cl. ....................... 438/518; 438/522; 438/604; 438/766; 438/767; 438/933
(58) Field of Search ................................ 438/518, 522, 438/604, 766, 767, 933

(56) References Cited

U.S. PATENT DOCUMENTS

| | | | | |
|---|---|---|---|---|
| 4,863,877 A | * | 9/1989 | Fan et al. | 438/492 |
| 5,735,949 A | * | 4/1998 | Mantl et al. | 117/8 |
| 6,150,239 A | * | 11/2000 | Goesele et al. | 438/458 |
| 6,369,438 B1 | * | 4/2002 | Sugiyama et al. | 257/616 |
| 6,444,509 B1 | * | 9/2002 | Noguchi et al. | 438/166 |
| 6,464,780 B1 | | 10/2002 | Mantl et al. | 117/90 |
| 6,500,732 B1 | * | 12/2002 | Henley et al. | 438/459 |
| 6,555,451 B1 | * | 4/2003 | Kub et al. | 438/542 |

OTHER PUBLICATIONS

S. Mantl et al., *Strain relaxation of epitaxial SiGe layer on silicon (100) improved by hydrogen implantation*, Nuclear Instruments and Methods in Physics Research B vol. 147, 29 (1999).

A.N. Larsen et al., *MeV ion implantation induced damage in relaxed $Si_{1-x}Ge_x$*, J. Appl. Phys., vol. 81, 2208 (1997).

D.Y.C. Lie, et al., *Dependence of damage and strain on the temperature of Si irradiation in epitaxial $Ge_{0.10}Si_{0.90}$ films on Si*, J. Appl. Phys. vol. 77, 2329 (1995).

T.E. Haynes, et al., *Damage accumulation during ion implantation of unstrained $Si_{1-x}Ge_x$ alloy layers*, Appl. Phys. Letts., vol. 61, 61 (1992).

O.W. Holland et al., *Damage saturation during high–energy ion implantation of $Si_{1-x}Ge_x$*, Appl. Phys. Lett, Vol 61, 3148 (1992).

(List continued on next page.)

*Primary Examiner*—George Fourson
*Assistant Examiner*—Michelle Estrada
(74) *Attorney, Agent, or Firm*—David C. Ripma; Matthew D. Rabdau

(57) ABSTRACT

A method of fabricating a $Si_{1-x}Ge_x$ film on a silicon substrate includes preparing a silicon substrate; epitaxially depositing a $Si_{1-x}Ge_x$ layer on the silicon substrate forming a $Si_{1-x}Ge_x$/Si interface there between; amorphizing the $Si_{1-x}Ge_x$ layer at a temperature greater than $T_c$ to form an amorphous, graded SiGe layer; and annealing the structure at a temperature of between about 650° C. to 1100° C. for between about ten seconds and sixty minutes to recrystallize the SiGe layer.

21 Claims, 2 Drawing Sheets

OTHER PUBLICATIONS

D.Y.C. Lie, et al., *Damage and strain in epitaxial $Ge_xSi_{1-x}$ films irradiated with Si*, J. Appl. Phys. vol. 74, 6039 (1993).

D.C. Paine, et al., *The growth of strained $Si_{1-x}Ge_x$ alloys on (001) silicon using solid phase epitaxy*, J. Mater. Res., vol. 5, 1023 (1990).

C. Lee, et al., *Kinetics of solid phase epitaxial regrowth in amorphized $Si_{0.88}Ge_{0.12}$ measured by time–resolved reflectivity*, Appl. Phys. Lett., vol. 62, 501 (1993).

Q.Z. Hong, et al., *Solid phase epitaxy of stressed and stress–relaxed Ge–Si alloys*, J. Appl. Phys. vol. 71, 1768 (1992).

\* cited by examiner

IMPLANTATION AT ELEVATED TEMPERATURES FOR AMORPHIZATION RE-CRYSTALLIZATION OF $SI_{1-x}GE_x$ FILMS ON SILICON SUBSTRATES

RELATED APPLICATIONS

This Application is related to (1) Method to form relaxed SiGe layer with high Ge content, Ser. No. 10/062,319, filed Jan. 31, 2002; (2) Method to form thick relaxed SiGe layer with trench structure, Ser. No. 10/062,336, filed Jan. 31, 2002; (3) Amorphization Re-crystallization of $Si_{1-x}Ge_x$ on Silicon film, Ser. No. 10/098,757, filed Mar. 13, 2002; (4) Method to form relaxed SiGe layer with high Ge content using implantation of molecular hydrogen, Ser. No. 10/099,374, filed Mar. 13, 2002 now U.S. Pat. No. 6,562,703; and (5), Amorphization Recrystallization of $Si_{1-x}Ge_x$ on Silicon Film; Ser. No. 10/124,853, filed Mar. 13, 2002.

FIELD OF THE INVENTION

This invention relates to devices for high speed CMOS integrated circuits, and specifically to fabrication of a SiGe film at an elevated temperature by providing a layer of tensile strained silicon on a relaxed $Si_{1-x}Ge_x$ layer to speed switching speeds for nMOS and pMOS transistors.

BACKGROUND OF THE INVENTION

There are many publications describing a thick layer of $Si_{1-x}Ge_x$ with graded Ge composition (x) followed by a thick relaxed $Si_{1-x}Ge_x$ layer of constant x capped by a thin silicon film under tensile strain, which is used for fabricating high drain drive current MOS transistors. Because of the lattice parameter mismatch between the $Si_{1-x}Ge_x$ layers and the silicon substrate there is a high density of misfit dislocations at the SiGe/Si substrate interface, accompanied by numerous threading dislocations in the SiGe some of which propagate all the way to the surface. The total SiGe thickness is on the order of several microns and the density of threading dislocations at the surface is still on the order of $1 \cdot 10^5$ cm$^{-2}$. A partial list of the relevant publications is given in related Application 1. However, the very thick $Si_{1-x}Ge_x$ layer, and the high defect density of this conventional $Si_{1-x}Ge_x$ process is not applicable for large-scale IC fabrication.

As is demonstrated in S. Mantl et al., *Strain relaxation of epitaxial SiGe layer on Si (100) improved by hydrogen implantation*, Nuclear Instruments and Methods in Physics Research B vol. 147, 29 (1999), and expanded upon in related Applications 1 and 2, strain relaxed high quality $Si_{1-x}Ge_x$ layers on silicon can be obtained by hydrogen ion implantation and annealing. Hydrogen ion implantation forms a narrow defect band slightly below the SiGe/Si interface. During subsequent annealing hydrogen platelets and cavities form, nucleating misfit dislocations and giving rise to strong enhanced strain relaxation in the $Si_{1-x}Ge_x$ epilayer. Hydrogen ions may also terminate some threading dislocations, preventing them from propagating toward the $Si_{1-x}Ge_x$ surface. Related Applications 1 and 2 describe methods to reduce defect density and fabricate high drive current MOS transistors on a relaxed $Si_{1-x}Ge_x$ film having thickness on the order of only 300 nm. However, the defect density of the $Si_{1-x}Ge_x$ film by these processes is still not suitable to very large-scale integrated circuit fabrication.

Related Application 3 describes a means to further reduce the defect density in $Si_{1-x}Ge_x$ films. In the method described in that Application, a buried amorphous region in the film is fabricated, e.g., with Si$^+$ ion implantation, and then recrystallized through solid phase epitaxy (SPE) using as the seed the undamaged crystalline $Si_{1-x}Ge_x$ region at the surface. However, the process window for making a buried amorphous region in SiGe may be rather narrow, because it has been consistently reported that SiGe is much more easily damaged by Si$^+$ ion implantation than silicon, A. N. Larsen et al., *MeV ion implantation induced damage in relaxed $Si_{1-x}Ge_x$*, J. Appl. Phys., vol. 81, 2208 (1997); T. E. Haynes, et al., *Damage accumulation during ion implantation of unstrained $Si_{1-x}Ge_x$ alloy layers*, Appl. Phys. Lett., vol. 61, 61 (1992); and D. Y. C. Lie, et al., *Damage and strain in epitaxial $Ge_xSi_{1-x}$ films irradiated with Si*, J. Appl. Phys. Vol. 74, 6039 (1993). The critical dose for amorphization, ($\phi_c$) decreases with increasing Ge concentration. This holds true for both strained and relaxed SiGe. This effect is thought to be due to both an increase in the average energy density per ion deposited in the collision cascade and a stabilization of the damage through a reduction of defect mobility in SiGe, Lie et al. and Haynes et al. To overcome this problem, related Application 5 describes the use of a thin silicon cap layer which acts as a crystalline seed for solid phase epitaxial regrowth of the underlying amorphized SiGe film. Because the silicon cap will experience considerably less damage from the Si$^+$ implant than the SiGe it should make a better template for the regrown crystal.

However, SPE of amorphized strained SiGe with more than 10% Ge has been observed to result in a heavily defected film, containing microtwins and stacking faults, which have been explained as a stress relief mechanism, D. C. Paine, et al., *The growth of strained $Si_{1-x}Ge_x$ alloys on (001) silicon using solid phase epitaxy*, J. Mater. Res., vol. 5, 1023 (1990), and C. Lee, et al., *Kinetics of solid phase epitaxial regrowth in amorphized $Si_{0.88}Ge_{0.12}$ measured by time-resolved reflectivity*, Appl. Phys. Lett., vol. 62, 501 (1993). Correspondingly, it has been reported that SPE of relaxed SiGe amorphized by Si$^+$ ion implantation results in a much better crystal than SPE of strained SiGe, Q. Z. Hong, et al., *Solid phase epitaxy of stresses and stress-relaxed Ge-Si alloys*, J. Appl. Phys. Vol. 71, 1768 (1992). Furthermore, the SPE recrystallization rate of strained SiGe is slower than that of silicon while the rate for relaxed SiGe is higher, which is attributed to changes in the activation barrier for SPE, Hong et al.

There is also a strong dependence on the wafer temperature during ion implantation, $T_I$, with the damage decreasing at higher $T_I$, so $\phi_c$ will depend on temperature, Haynes et al. This is thought to be due to the increased mobility at higher temperatures of the defects resulting from implantation, Haynes et al.; D. Y. C. Lie, et al., *Dependence of damage and strain on the temperature of Si irradiation in epitaxial $Ge_{0.10}Si_{0.90}$ films on Si (100)*, J. Appl. Phys. Vol. 77, 2329 (1995); and O. W. Holland, et al., *Damage saturation during high-energy ion implantation of $Si_{1-x}Ge_x$*, Appl. Phys. Lett., vol. 61, 3148 (1992). This is reported to be a strong effect, occurring fairly abruptly, so that the same implant, e.g., $1 \cdot 10^{15}$ Si$^+$ ions at 320 keV, will amorphize $Si_{0.9}Ge_{0.1}$ at $T_I$=60° C., but barely damage the lattice at 100° C., Lie, et al., supra. Also, at elevated $T_I$, the damage may depend on dose rate as well as total dose, Haynes et al. Another effect reported to occur at elevated wafer temperatures is saturation of the damage during Si$^+$ ion implantation, Holland et al. If Si$^+$ ions are implanted into Si, SiGe, or Ge at $T_I$ greater than some critical value, $T_c$, the surface damage will not rise above a relatively low value no matter what the dose; i.e., it saturates. Meanwhile, as the dose is increased the end-of-range (EOR) damage grows until a buried amorphous region is produced. However, if $T_I$ is too high, it may not be possible to produce an amorphous region, regardless of dose, Haynes et al. If the implant is performed at $T_I$ below $T_c$, the damage in both the surface region and EOR will increase with dose. Consequently, there is expected to be an optimum temperature range for $T_I$ which allows fabrication of a buried amorphous region while preserving a crystalline surface layer. $T_c$ is composition dependent: e.g. ~24° C., 69° C., 133° C., and 114° C. for Si, 15% Ge, 50% Ge, and 100% Ge, at a 1.25 meV implant energy, respectively, Holland et al. The method of the invention described herein makes use of these temperature effects to preserve the crystal quality of the surface region during $Si^+$ or $Ge^+$ ion implantation of SiGe while producing a buried amorphous region. By so doing a better quality crystal can be fabricated after solid phase epitaxial regrowth.

SUMMARY OF THE INVENTION

A method of fabricating a $Si_{1-x}Ge_x$ film on a silicon substrate includes preparing a silicon substrate; epitaxially depositing a $Si_{1-x}Ge_x$ layer on the silicon substrate forming a $Si_{1-x}Ge_x/Si$ interface there between; amorphizing the $Si_{1-x}Ge_x$ layer at a temperature greater than $T_c$ to form an amorphous, SiGe layer; and annealing the structure at a temperature of between about 650° C. to 1100° C. for between about ten seconds and sixty minutes to recrystallize the SiGe layer.

It is an object of the invention to make use of temperature effects during amorphization to preserve the crystal quality of the surface region.

Another object of the invention is to produce a buried amorphous region by $Si^+$ or $Ge^+$ ion implantation into a SiGe layer at a temperature above $T_c$.

Another object of the invention is to provide a method to produce low defect density, 200 nm to 500 nm thick relaxed $Si_{1-x}Ge_x$ films with Ge content of up to 50% or more at the top surface for large-scale integrated circuit application.

A further object of the invention is to provide a better quality crystal after solid phase eptiaxial regrowth.

Another object of the invention is to provide a strained silicon layer on a relaxed $Si_{1-x}Ge_x$ layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

As explained above, SiGe is more easily damaged by ion implantation than is Si, making it difficult to produce a buried amorphous layer in SiGe. However, if the wafer temperature during implantation is above a critical temperature, $T_c$, the damage in the surface region saturates at a relatively low value, Holland et al. Therefore, by implanting $Si^+$ or $Ge^+$ ions above $T_c$, but not at too high a temperature, the crystallinity of the surface SiGe is more easily preserved and is able to form a template for solid phase epitaxy (SPE) of the amorphized SiGe layer beneath. The method of the invention includes implantation of $Si^+$ or $Ge^+$ ions at an optimum temperature above $T_c$ to produce a buried amorphous layer in a $Si_{1-x}Ge_x$ film while preserving the crystallinity of the surface region. The $Si_{1-x}Ge_x$ film may or may not have a thin silicon cap. Furthermore, prior to $Si^+$ implantation the $Si_{1-x}Ge_x$ film may be pseudomorphic to the silicon substrate or relaxed.

Figure 1:
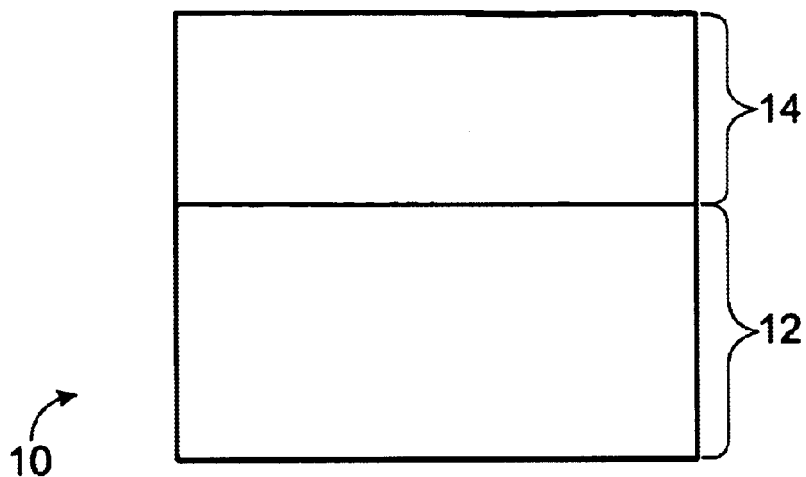
FIG. 1 depicts an as-grown film.

Referring now to FIG. 1, the method of the invention for elevated temperature defect reduction includes forming a structure 10, including preparation of a silicon substrate 12, having an as-grown $Si_{1-x}Ge_x$ pseudomorphic (strained) film 14 thereon. In this first embodiment of the method of the invention, no silicon cap is formed over the $Si_{1-x}Ge_x$ pseudomorphic film. Silicon substrate 12 is prepared by state-of-the-art techniques. Graded $Si_{1-x}Ge_x$ epitaxial layer 14 is grown to a thickness such that there is no relaxation in the $Si_{1-x}Ge_x$ layer at the growth temperature; such a film may be thermodynamically metastable but still free of dislocations. The value of x at the bottom of the $Si_{1-x}Ge_x$ layer, that is at the $Si_{1-x}Ge_x/Si$ interface, can be lower than 0.05 while at the top surface of the $Si_{1-x}Ge_x$ layer it is between about 0.2 to 0.5 or greater. The Ge concentration may be increased linearly, stepwise, or in some other fashion with increasing $Si_{1-x}Ge_x$ thickness. This is suitable for a $Si_{1-x}Ge_x$ film thickness of between about 200 nm to 500 nm. Because the SiGe film is not relaxed the top surface, is free from defects. Alternatively, a $Si_{1-x}Ge_x$ epitaxial layer with constant value of x may be grown, but for a given value of x at the top surface a thinner film is required to avoid the nucleation of dislocations and resulting relaxation. If desired, a thin epitaxial silicon cap may be grown on top of the $Si_{1-x}Ge_x$ epitaxial layer, which variation of the method of the invention will be described later herein.

Figure 2:
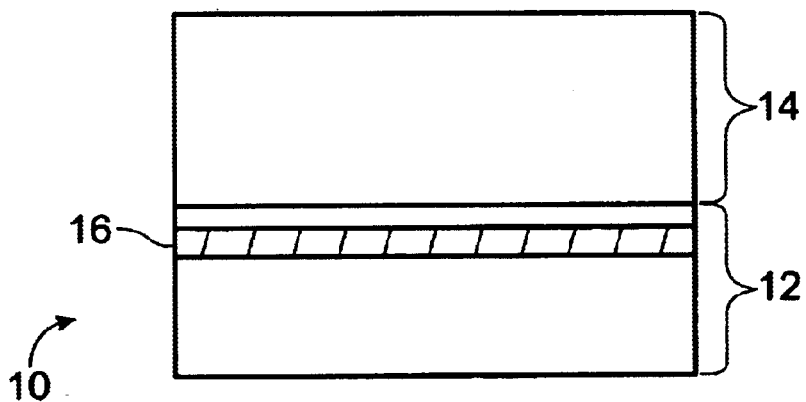
FIG. 2 depicts a cross-section of the film after hydrogen implantation before any annealing.

Referring now to FIG. 2, hydrogen ions, e.g., H+, on the order of $1 \cdot 10^{16}$ $cm^{-2}$ to $4 \cdot 10^{16}$ $cm^{-2}$ are implanted into the $Si_{1-x}Ge_x$ film at a proper ion energy, e.g., 30 keV to 80 keV, which provides a projected depth of between about 3 nm to 100 nm below than the $Si_{1-x}Ge_x/Si$ interface, forming a layer 16 having a high density of hydrogen. Alternatively, singly ionized molecular hydrogen, e.g., $H_2$+, with half the dose but twice the energy of H+ may be used, as described in related Application 4. Another alternative is to implant boron with the hydrogen, or to use helium ions. Another alternative is to perform no implantation, in which case, the following step is not required.

Figure 3:
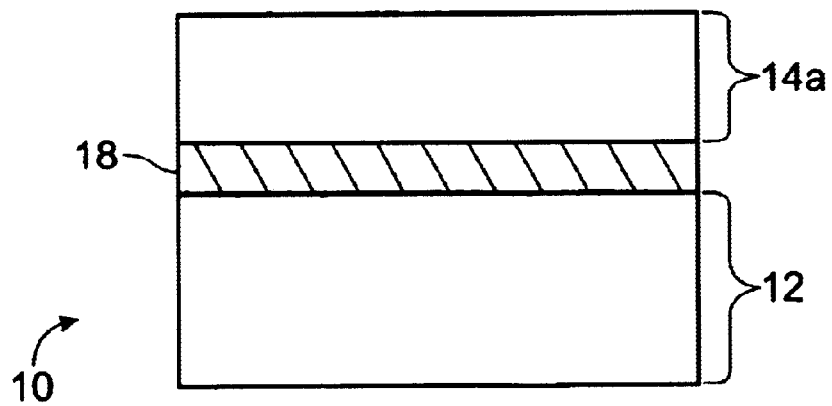
FIG. 3 depicts a cross-section of the film after relaxation annealing.

Referring to FIG. 3, the films may be annealed to relax the SiGe layer, forming a graded, relaxed SiGe layer 14a. The annealing temperature is between about 700° C. to 1100° C. The annealing time is between about 10 seconds to longer than 60 minutes. Rapid thermal annealing or furnace annealing may be used. During the anneal, hydrogen ions under the $Si_{1-x}Ge_x/Si$ interface form hydrogen platelets and cavities which enhance nucleation of misfit dislocations and so improve the efficiency of relaxation, forming a high defect SiGe/Si interface region 18. Alternatively, annealing may be delayed until after implantation of the amorphizing species, as described next.

Figure 4:
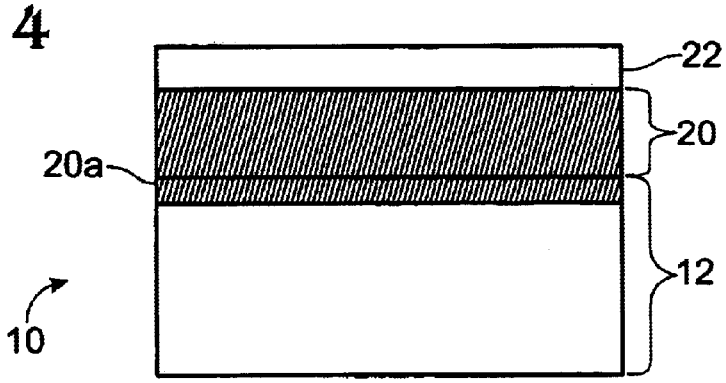
FIG. 4 depicts a cross-section of the film after $Si^+$ or $Ge^+$ ion implantation at an optimum wafer temperature above $T_c$.

Referring now to FIG. 4, a high dose, e.g., $5 \cdot 10^{13}$ $cm^{-2}$ to $10 \cdot 10^{15}$ $cm^{-2}$ of heavy ions, such as $Si^-$, implanted at and energy of between about 30 keV to 500 keV, or Ge+ implanted at an energy of between about 60 keV to 1000 keV, are implanted into the $Si_{1-x}Ge_x$ epilayer to produce a buried amorphous film 20, which layer 20a may extend into silicon substrate 12, forming an amorphous layer near the SiGe/Si interface. During implantation the wafer is kept above a composition-dependent critical temperature, $T_c$, so that the implantation-induced damage in the surface region saturates at a relatively low value. However, the temperature should not be too high, or it may be difficult to amorphize any of the SiGe film. For example, for a 50% Ge film, where $T_c \sim 133°$ C., an implant temperature of 155° C. with a Si+ dose of $4 \cdot 10^{15}$ cm$^{-2}$ has been reported to be effective, Holland et al. Ideally the entire $Si_{1-x}Ge_x$ layer, except the top 10 nm to 50 nm, 22, which is only lightly damaged, will be converted to an amorphous structure. Therefore, multi-energy ion implantation is preferred for thicker $Si_{1-x}Ge_x$ films. The silicon cap, if present, will be more resistant to implant damage and should remain as a crystalline seed for subsequent SPE.

Next, the wafers undergo high temperature annealing, resulting in solid phase re-crystallization. The annealing temperature is between about 650° C. to 1100° C. The annealing time is between about 10 seconds to longer than 60 minutes. Rapid thermal annealing or furnace annealing may be used. The recrystallization will proceed from both the top high quality layer and from the $Si_{1-x}Ge_x$/Si interface. However, the recrystallization from the lower interface will likely be heavily defected due to strain. Therefore, the amorphizing species must be implanted deeply enough so that these defects will be below the space charge region during transistor operation. Moreover, the rate of the recrystallization from the SiGe/Si interface may be slower, resulting in most of the SiGe film being recrystallized from the top layer, which is desirable.

Figure 5:
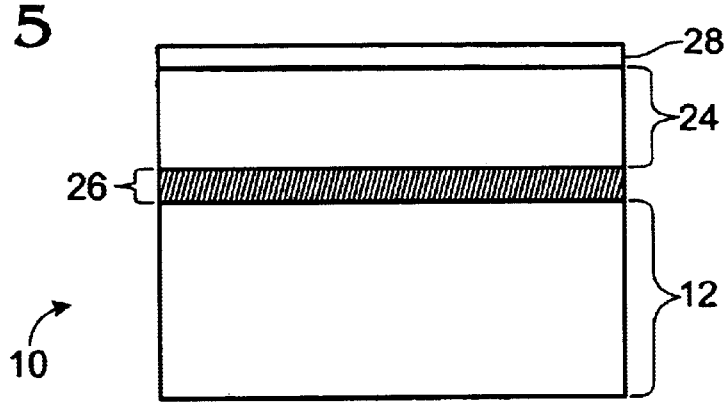
FIG. 5 depicts a cross-section of the film after SPE recrystallization and growth of tensile-strained silicon cap.

Referring to FIG. 5, when the SiGe film re-crystallizes, layer 24, it is relaxed and defect free. A thin, e.g., 10 nm to 20 nm, tensile-strained pure silicon cap 28 may be epitaxially grown on top of layer 24, as required for production of high mobility MOS transistors.

Figure 6:
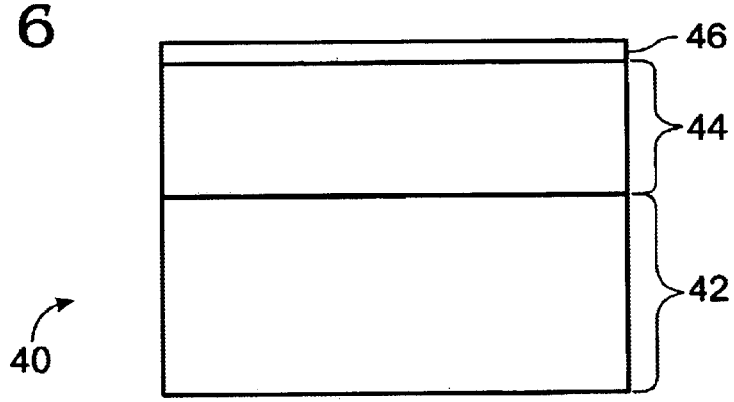
FIG. 6 depicts an as-grown film fabricated by an alternate method of the invention.
Figure 7:
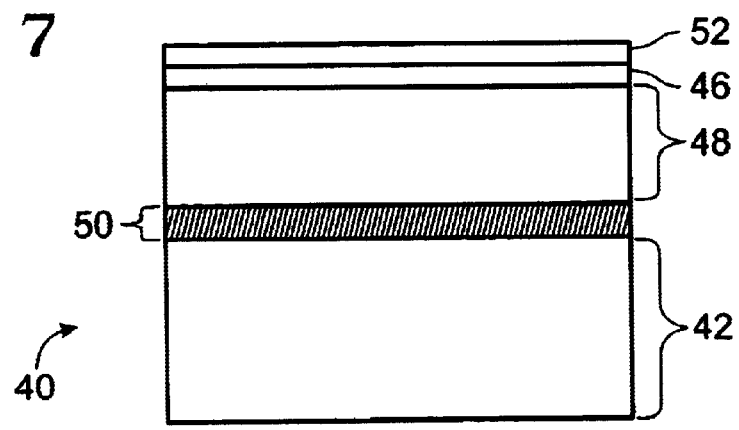
FIG. 7 depicts a cross-section of the film after SPE recrystallization and growth of a second tensile-strained silicon cap according to the method of FIG. 6.

Referring to FIG. 6, a structure 40 constructed according to an alternate method of the invention includes a silicon substrate 42 having a $Si_{1-x}Ge_x$ pseudomorphic film 44 thereon. Following epitaxial deposition of the $Si_{1-x}Ge_x$ pseudomorphic film, a silicon cap 46 is formed. The thickness of silicon cap 46 is much less than that of the SiGe; e.g., on the order of between about 10 nm to 20 nm. This silicon cap will be relaxed, having the same cubic structure and lattice constant as the silicon substrate. Cap 46 acts as a seed layer for SPE. However, during the annealing steps substantial amounts of Ge may diffuse into the silicon cap. If necessary, a second thin, e.g., 10 nm to 20 nm, tensile-strained pure silicon cap 52 can then be epitaxially grown on top of silicon cap 46, as shown in FIG. 7, which includes a relaxed SiGe film re-crystallized layer 48 and a high defect layer 50.

In an alternative embodiment of the method of the invention, the process begins with formation of a thick, relaxed SiGe virtual substrate, e.g., several microns thick, as described in related Application 1. Because these substrates contain a high level of threading dislocations reaching the surface, typically $\sim 1 \cdot 10^5$ cm$^{-2}$, it may be possible to reduce these defect levels by the method of the instant invention. Specifically, a thin silicon cap may be used as a less easily damaged seed layer for SPE, implant Si− or Ge+ ions while keeping the wafer at an optimum temperature above $T_c$, to produce a buried amorphous SiGe region, and recrystallize the SiGe by an appropriate anneal. A thin, tensile-strained pure silicon cap 28 may be epitaxially grown on top of layer 24. The Si/$Si_{1-x}Ge_x$ structure constructed according to the method of the invention is operable to speed switching of pMOS and nMOS transistors.

Thus, a method for implantation at elevated temperatures for amorphization re-crystallization of $Si_{1-x}Ge_x$ films on silicon substrates has been disclosed. It will be appreciated that further variations and modifications thereof may be made within the scope of the invention as defined in the appended claims.

We claim:

1. A method of fabricating a $Si_{1-X}Ge_X$ film on a silicon substrate as part of an integrated circuit structure, comprising:

preparing a silicon substrate;

epitaxially depositing a $Si_{1-X}Ge_X$ layer on the silicon substrate forming a $Si_{1-X}Ge_X$/Si interface there between;

amorphizing the $Si_{1-X}Ge_X$ layer at a temperature greater than $T_c$ to form an amorphous, graded SiGe layer; and annealing the structure at a temperature of between about 650° C. to 1100° C. for between about ten seconds and sixty minutes to recrystallize the SiGe layer.

2. The method of claim 1, which includes, after said epitaxially depositing, implanting hydrogen ions through the $Si_{1-X}Ge_X$ layer to a depth of between about 3 nm to 100 nm below the $Si_{1-X}Ge_X$/Si interface.

3. The method of claim 2 which includes, after said implanting, annealing the structure for between about ten seconds and sixty minutes at a temperature of between about 700° C. to 1000° C.

4. The method of claim 2 wherein said implanting hydrogen ions includes implanting H+ ions at a dose of between about $1 \cdot 10^{16}$ cm$^{-2}$ to $4 \cdot 10^{16}$ cm$^{-2}$ an energy level of between about 30 keV to 80 keV.

5. The method of claim 2 wherein said implanting hydrogen ions includes implanting boron ions with the H+ ions.

6. The method of claim 2 wherein said implanting hydrogen ions includes implanting $H_2$+ ions at a dose of between about $5 \cdot 10^{16}$ cm$^{-2}$ to $2 \cdot 10^{16}$ cm$^{-2}$ at an energy level of between about 60 keV to 160 keV.

7. The method of claim 2 wherein said implanting hydrogen ions includes implanting boron ions with the $H_2$+ ions.

8. The method of claim 1 wherein said epitaxially depositing a $Si_{1-X}Ge_X$ layer on the silicon substrate includes depositing a graded $Si_{1-X}Ge_X$ wherein x is between about less than 0.05 at the $Si_{1-X}Ge_X$/Si interface and is between about 0.2 to greater than or equal to 0.5 at the top of the $Si_{1-X}Ge_X$ layer, and which further includes depositing the $Si_{1-X}Ge_X$ layer to a thickness of between about 200 mn to 500 nm.

9. The method of claim 1 which includes, after said epitaxially depositing epitaxially growing a silicon cap on the $Si_{1-X}Ge_X$ layer includes growing a silicon cap to a thickness of between about 10 nm to 20 nm.

10. The method of claim 1 wherein said amorphizing the $Si_{1-X}Ge_X$ layer to form an amorphous, graded SiGe layer includes implanting ions taken from the group of ions consisting of silicon ions implanted at a dose of between about $5 \cdot 10^{13}$ cm$^{-2}$ to $5 \cdot 10^{15}$ cm$^{-2}$ at an energy of between about 30 keV to 500 keV and germanium implanted at a dose of between about $5 \cdot 10^{13}$ cm$^{-2}$ to $5 \cdot 10^{15}$ cm$^{-2}$ at an energy of between about 60 keV to 1000 keV.

11. The method of claim 1 wherein said amorphizing is done at a temperature of between about 200° C. to 450° C.

12. The method of claim 9 which further includes growing a second silicon cap over the structure following the final annealing.

13. A method of fabricating a $Si_{1-x}Ge_X$ film on a silicon substrate as part of an integrated circuit structure, comprising:

preparing a silicon substrate;

epitaxially depositing a graded $Si_{1-x}Ge_X$ layer on the silicon substrate, wherein x is between about less than 0.05 at the $Si_{1-x}Ge_X/Si$ interface and is between about 0.2 to greater than or equal to 0.5 at the top of the $Si_{1-x}Ge_X$ layer, and which further includes depositing the $Si_{1-x}Ge_X$ layer to a thickness of between about 200 nm to 500 nm forming a $Si_{1-x}Ge_X/Si$ interface, there between.

implanting hydrogen ions through the $Si_{1-x}Ge_X$ layer to a depth of between about 3 nm to 100 nm below the $Si_{1-x}Ge_X/Si$ interface, including implanting hydrogen ions taken from the group of hydrogen ions consisting of H+ ions implanted at a dose of between about $1 \cdot 10^{16}$ cm$^{-2}$ to $4 \cdot 10^{16}$ cm$^{-2}$ at an energy level of between about 30 keV to 80 keV and $H_2$+ ions implanted at a dose of between about $0.5 \cdot 10^{16}$ cm$^{-2}$ to $2 \cdot 10^{16}$ cm$^{-2}$ at an energy level of between about 60 keV to 160 keV; and implanting boron ions with the hydrogen ions;

annealing the structure for between about ten seconds and sixty minutes at a temperature of between about 700° C. to 1100° C.

amorphizing the $Si_{1-x}Ge_X$ layer to from an amorphous, graded SiGe layer, by implanting ions taken from the group of ions consisting of silicon ions implanted at a dose of between about $5 \cdot 10^{13}$ cm$^{-2}$ to $5 \cdot 10^{15}$ cm$^{-2}$ at an energy of between about 30 keV to 500 keV and germanium implanted at a dose of between about $5 \cdot 10^{13}$ cm$^{-2}$ to $5 \cdot 10^{15}$ cm$^{-2}$ at an energy of between about 60 keV to 1000 keV at a temperature greater than $T_c$; and annealing the structure at a temperature of between about 650° C. to 1100° C. for between about ten seconds and sixty minutes to recrystallize the SiGe layer.

14. The method of claim 13 which includes, after said epitaxially depositing epitaxially growing a silicon cap on the $Si_{1-x}Ge_X$ layer to a thickness of between about 10 nm to 20 nm.

15. The method of claim 14 which further includes growing a second silicon cap over the structure following the final annealing.

16. A method of fabricating a $Si_{1-x}Ge_X$ film on a silicon substrate as part of an integrated circuit structure, comprising:

preparing a silicon substrate;

epitaxially depositing a $Si_{1-x}Ge_X$ layer on the silicon substrate forming a $Si_{1-x}Ge_X/Si$ interface there between, wherein the $Si_{1-x}Ge_X$ is deposited to a thickness such that there is no relaxation at the growth temperature;

epitaxially growing a silicon cap on the $Si_{1-x}Ge_X$ layer to a thickness of between about 10 nm to 20 nm;

implanting hydrogen ions through the $Si_{1-x}Ge_X$ layer to a depth of between about 3 nm to 100 nm below the $Si_{1-x}Ge_X/Si$ interface;

amorphizing the $Si_{1-x}Ge_X$ layer to form an amorphous, graded SiGe layer, by implanting ions taken from the group of ions consisting of silicon ions implanted at a dose of between about $5 \cdot 10^{13}$ cm$^{-2}$ to $5 \cdot 10^{15}$ cm$^{-2}$ at an energy of between about 30 keV to 500 keV and germanium implanted at a dose of between about $5 \cdot 10^{13}$ cm$^{-2}$ to $5 \cdot 10^{15}$ cm$^{-2}$ at an energy of between about 60 keV to 1000 keV at a temperature of between about 200° C. to 450° C.; and annealing the structure at a temperature of between about 650° C. to 1100° C. for between about ten seconds and sixty minutes to recrystallize the SiGe layer.

17. The method of claim 16 which includes, after said implanting hydrogen ions, annealing the structure for between about ten seconds and sixty minutes at a temperature of between about 700° C. to 1100° C.

18. The method of claim 16 wherein said epitaxially depositing a $Si_{1-x}Ge_X$ layer on the silicon substrate includes depositing a graded $Si_{1-x}Ge_X$ wherein x is between about less than 0.05 at the $Si_{1-x}Ge_X/Si$ interface and is between about 0.2 to greater than or equal to 0.5 at the top of the $Si_{1-x}Ge_X$ layer, and which further includes depositing the $Si_{1-x}Ge_X$ layer to a thickness of between about 200 nm to 500 nm.

19. The method of claim 16 wherein said implanting hydrogen ions includes implanting ions taken from the group of ions consisting of H+ ions implanted at a dose of between about $1 \cdot 10^{16}$ cm$^{-2}$ to $4 \cdot 10^{16}$ cm$^{-2}$ at an energy level of between about 30 keV to 80 keV and $H_2$+ ions implanted at a dose of between about $0.5 \cdot 10^{16}$ cm$^{-2}$ to $2 \cdot 10^{16}$ cm$^{-2}$ at an energy level of between about 60 keV to 160 keV.

20. The method of claim 19 wherein said implanting hydrogen ions includes implanting boron ions with the hydrogen ions.

21. The method of claim 16 which further includes growing a second silicon cap over the structure following the final annealing.

* * * * *